United States Patent [19]

Takemoto

[11] Patent Number: 5,345,464
[45] Date of Patent: Sep. 6, 1994

[54] SEMICONDUCTOR LASER

[75] Inventor: Akira Takemoto, Itami, Japan

[73] Assignee: Mitsubishi Denki Kabushiki Kaisha, Tokyo, Japan

[21] Appl. No.: 124,018

[22] Filed: Sep. 21, 1993

[30] Foreign Application Priority Data

Dec. 21, 1992 [JP] Japan .................................. 4-356621

[51] Int. Cl.$^5$ ................................................ H01S 3/19
[52] U.S. Cl. .......................................... 372/46; 372/45
[58] Field of Search ..................................... 372/46, 45

[56] References Cited

U.S. PATENT DOCUMENTS 4,972,238 11/1990 Tanaka .............................. 372/45 X
4,984,244 1/1991 Yamamoto et al. ................... 372/46

FOREIGN PATENT DOCUMENTS 60-154587 8/1985 Japan .
63-90879 4/1988 Japan .
1264287 10/1989 Japan .

OTHER PUBLICATIONS

Takemoto et al., "Improvement Of High Power/High Temperature Operation Of Long Wavelength Laser Diodes By Band Discontinuity Reduction Layer", IEEE International Semiconductor Laser Conference, Sep. 1992, pp. 48–49.

Takemoto et al, "1 3 $\mu$m InGaAsP/InP Distributed-Feedback P-Substrate Partially Inverted Buried-Heterostructure Laser Diode", Electronics Letters, vol. 23, No. 11, May 1987, pp. 546–547.

Shim et al, "A New Distributed-Reflector (DR)-Type Dynamic-Single-Mode Laser", IEICE Fall Conference, Sep. 1991, p. 4–158.

Yamaguchi et al, "Highly Efficient Single-Longitudinal-Mode Operation Of Antireflection-Coated 1 3 $\mu$m DFB-DC-PBH LD", Electronics Letters, vol. 20, No. 6, Mar. 1984, pp. 233–235.

Besomi et al, "High-Temperature Operation Of 1 55 $\mu$m InGaAsP Double-Channel Buried-Heterostructure Lasers Grown By LPE", Electronics Letters, vol. 20, No. 10, May 1984, pp. 417–419.

*Primary Examiner*—James W. Davie
*Attorney, Agent, or Firm*—Leydig, Voit & Mayer

[57] ABSTRACT

A semiconductor laser includes a semiconductor substrate of a first conductivity type; a double heterojunction structure comprising a lower cladding layer of the first conductivity type disposed on the semiconductor substrate and having a first energy band gap, a band gap discontinuity reduction layer of the first conductivity type having a thickness from five to forty nanometers disposed on the lower cladding layer and having a second energy band gap, an undoped active layer disposed on the band gap discontinuity reduction layer and having a third energy band gap smaller than the first energy band gap, the second energy band gap being intermediate the first and third energy band gaps, and an upper cladding layer of a second conductivity type, opposite the first conductivity type, disposed on the active layer and having a fourth energy band gap larger than the third energy band gap, the double heterojunction structure having a ridge shape; a current confinement structure disposed on opposite sides of the double heterojunction structure for confining current flow to the double heterojunction structure; and first and second electrodes electrically contacting the semiconductor substrate and the upper cladding layer, respectively.

23 Claims, 9 Drawing Sheets energy energy energy energy

SEMICONDUCTOR LASER

FIELD OF THE INVENTION

The present invention relates to a semiconductor laser providing a relatively high output power with reduced current flow.

BACKGROUND OF THE INVENTION

FIG. 1 is a perspective view of a prior art semiconductor laser described in *Electronic Letters*, volume 23, 1987, pages 546–547. A schematic sectional view of the laser is shown in FIG. 2 to illustrate current flow in the laser. The illustrated structure includes a p-type InP substrate 1, a p-type InP lower cladding layer 2 disposed on part of the substrate 1, an InGaAsP active layer 3 disposed on part of the lower cladding layer 2, and an n-type InP upper cladding layer 4 disposed on the active layer 3. The lower and upper cladding layers and the active layer have a ridge structure that is confined at its longitudinal sides by a current confinement structure. The lower and upper cladding layers and active layer are grown by liquid phase epitaxy (LPE) and the ridge is formed by etching those layers with a mask present on what becomes the top surface of the ridge.

The current confinement structure illustrated in FIG. 1 includes a p-type InP layer 5 disposed on part of the substrate 1 and extending up the sides of the ridge to the upper cladding layer 4. An n-type InP current blocking layer 6 is disposed on parts of the p-type InP layer 5. An additional p-type InP current blocking layer 7 is disposed on the n-type layer 6 and part of the p-type layer 5. A second n-type upper cladding layer 8 is disposed on the p-type layer 7 as well as on the top of the ridge, i.e., in contact with the upper cladding layer 4. Finally, an n-type InGaAsP contacting layer 9 is disposed on the second upper cladding layer 8. As discussed in more detail below, the pn junctions within the structure constrain current to flow through the active layer in order to provide laser oscillation and light output. In order to further confine current to the ridge within the structure, an $SiO_2$ film 20 including a window opposite the ridge is disposed on the top and side surfaces of the laser structure. A first electrode 21 is disposed on the substrate 1 and a second electrode 22 is disposed on the $SiO_2$ film 20, contacting the InGaAsP contacting layer 9 through the window in that $SiO_2$ film 20.

When a forward bias is applied across the laser of FIG. 1, electrons and holes are injected into the active layer 3 and recombine to produce light having an energy approximately equal to the band gap energy of the active layer 3. The light thus generated travels along a waveguide defined by the current confinement structure, the upper and lower cladding layers, and opposed facets transverse to the active layer 3. When the amplification rate exceeds a threshold, i.e., when the current flowing in the forward biased laser exceeds a threshold current, laser oscillation occurs and coherent light is emitted through one of the facets that is covered by a partially reflective coating.

As illustrated in FIG. 2, most of the current flows along the path indicated by $C_1$, through the upper and lower cladding layers and the active layer. However, some leakage current flows along the paths indicated as $C_2$ and $C_3$. Path $C_2$ includes a single pn junction whereas path $C_3$ includes current flow through a pnpn structure. These leakage currents do not contribute to the light output of the semiconductor laser and increase as the current through the laser increases, i.e., as the voltage applied across the laser increases. The leakage currents elevate the temperature of the semiconductor laser and limit its power output. Even the pnpn thyristor current confinement structure does not adequately reduce the leakage current so that the power output of the laser can be increased.

SUMMARY OF THE INVENTION

It is an object of the present invention to provide a semiconductor laser that produces a high power output with reduced leakage current.

In a first aspect of the invention, a semiconductor laser includes a semiconductor substrate of a first conductivity type; a double heterojunction structure comprising a lower cladding layer of the first conductivity type disposed on the semiconductor substrate and having a first energy band gap, a band gap discontinuity reduction layer of the first conductivity type having a thickness from five to forty nanometers disposed on the lower cladding layer and having a second energy band gap, an undoped active layer disposed on the band gap discontinuity reduction layer and having a third energy band gap smaller than the first energy band gap, the second energy band gap being intermediate the first and third energy band gaps, and an upper cladding layer of a second conductivity type, opposite the first conductivity type, disposed on the active layer and having a fourth energy band gap larger than the third energy band gap, the double heterojunction structure having a ridge shape; a current confinement structure disposed on opposite sides of the double heterojunction structure for confining current flow to the double heterojunction structure; and first and second electrodes electrically contacting the semiconductor substrate and the upper cladding layer, respectively.

In a second aspect of the invention, a semiconductor laser includes a semiconductor substrate of a first conductivity type; a double heterojunction structure comprising a lower cladding layer of the first conductivity type disposed on the semiconductor substrate and having a first energy band gap, an undoped active layer disposed on the lower cladding layer and having a second energy band gap smaller than the first energy band gap, a band gap discontinuity reduction layer of a second conductivity type, opposite the first conductivity type, having a thickness from five to forty nanometers disposed on the active layer and having a third energy band gap, and an upper cladding layer of the second conductivity type, disposed on the band gap discontinuity reduction layer and having a fourth energy band gap, the third energy band gap being intermediate the second and fourth energy band gaps and the first energy band gap being larger than the second energy band gap, the double heterojunction structure having a ridge shape; a current confinement structure disposed on opposite sides of the double heterojunction structure for confining current flow to the double heterojunction structure; and first and second electrodes electrically contacting the semiconductor substrate and the upper cladding layer, respectively.

DETAILED DESCRIPTION OF PREFERRED EMBODIMENTS

Figure 3:
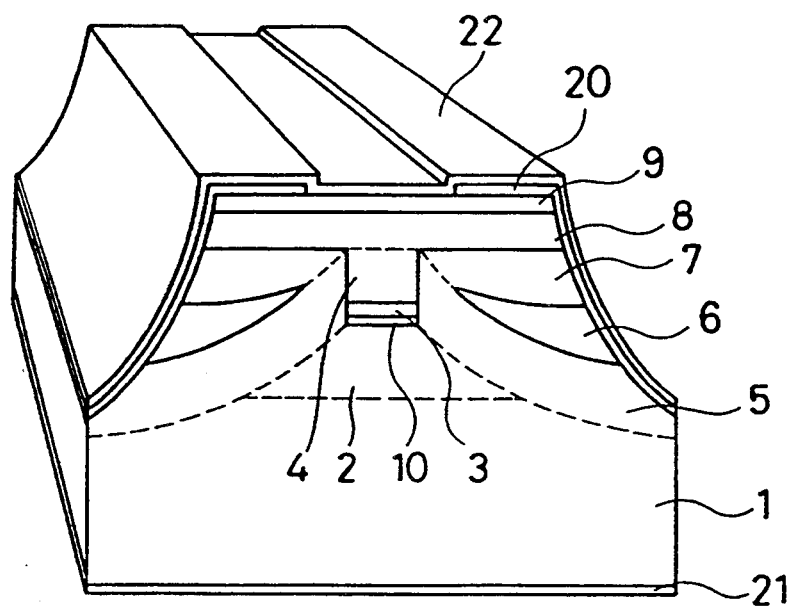
FIG. 3 is a perspective illustrating the structure of a semiconductor laser according to an embodiment of the invention.
Figure 4:
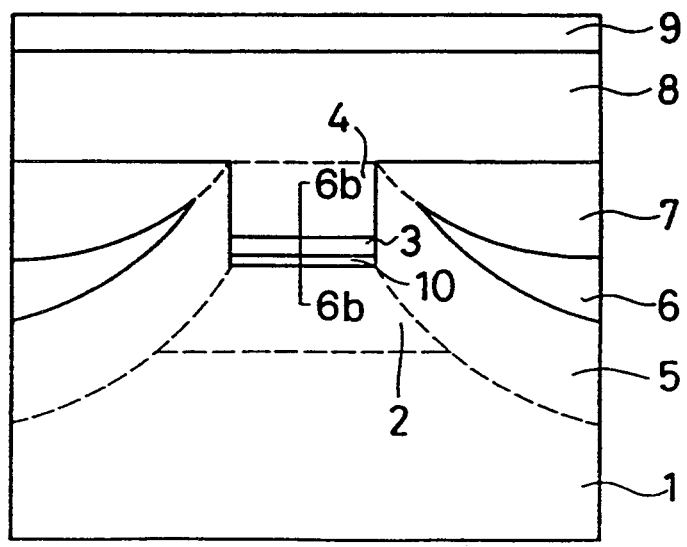
FIG. 4 is a cross-sectional view of the semiconductor laser of FIG. 3.

FIG. 3 is a perspective view of an embodiment of a semiconductor laser according to the present invention. FIG. 4 is a schematic cross-sectional view of that laser structure. The fundamental structure of the semiconductor laser of FIG. 3 is similar to the structure of the prior art semiconductor laser of FIG. 1. In all of the figures, like elements are given the same reference numbers so that it is not necessary to describe the same elements repeatedly. The semiconductor laser of FIG. 3 includes, in addition to the elements of the semiconductor laser of FIG. 1, an InGaAsP band discontinuity reduction (BDR) layer 10 disposed in the ridge structure between and contacting the lower cladding layer 2 and the active layer 3. In a preferred form of the invention, the lower cladding layer 2, the BDR layer 10, the active layer 3, and the upper cladding layer 4 are successively grown on the substrate 1 by metal organic chemical vapor deposition (MOCVD) as described in more detail below. The relative concentrations of the constituents of InGaAsP in the BDR layer 10 and in the active layer 3 are different so that the energy band gap of the BDR layer 10 is larger than the energy band gap of the active layer 3. In other words, a heterojunction is formed between the BDR layer 10 and the active layer 3. The BDR layer 10 has an energy band gap that is larger than the energy band gap of the active layer 3 but smaller than the energy band gap of the lower cladding layer 2. For the reasons explained below, the thickness of the BDR layer 10 is limited to a range from five to forty nanometers (nm).

Figure 5A:
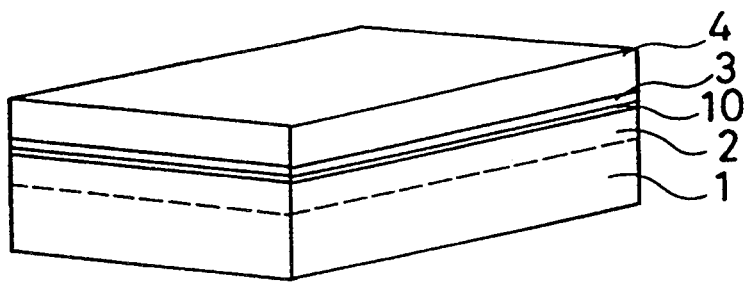
FIGS. 5(a)-5(e) illustrate steps in a process for manufacturing a semiconductor laser according to an embodiment of the invention.

A method of fabricating the laser structure of FIG. 3 is illustrated in FIGS. 5(a)-5(e). Initially, as illustrated in FIG. 5(a), a p-type InP substrate 1, having an energy band gap of about 1.35 eV, has a p-type InP cladding layer 2 about one micron thick and having a carrier concentration of about $1 \times 10^{18}$ cm$^{-3}$ at room temperature, a p-type In$_{0.82}$Ga$_{0.18}$As$_{0.4}$P$_{0.6}$ BDR layer 10 having an energy band gap of about 1.1 eV and five to forty nm thick with a carrier concentration of about $1 \times 10^{18}$ cm$^{-3}$ at room temperature, an undoped In$_{0.58}$Ga$_{0.42}$As$_{0.9}$P$_{0.1}$ active layer 3 having an energy band gap of about 0.8 eV and about 0.1 micron thick, and an n-type InP cladding layer about 1 micron thick and having a carrier concentration of $1 \times 10^{18}$ cm$^{-3}$ successively grown on it, preferably by MOCVD.

Figure 5B:
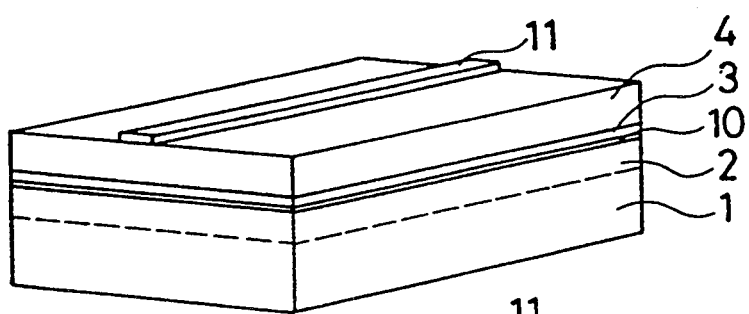
Figure 5C:
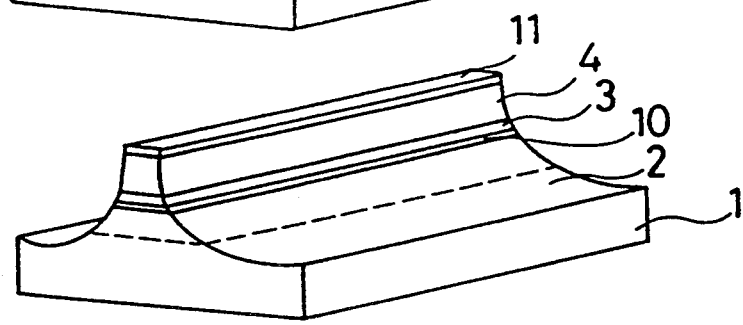

A photoresist mask 11 is formed on the InP upper cladding layer 4 by conventional photolithographic techniques, producing the structure shown in FIG. 5(b). This structure is subsequently etching using the photoresist pattern as an etching mask. Typically, a bromine-methanol etchant is used to etch the structure to produce the ridge illustrated in FIG. 5(c). As a result of that etching, the width of the active layer 3 in the ridge structure is about 1.5 microns.

Figure 5D:
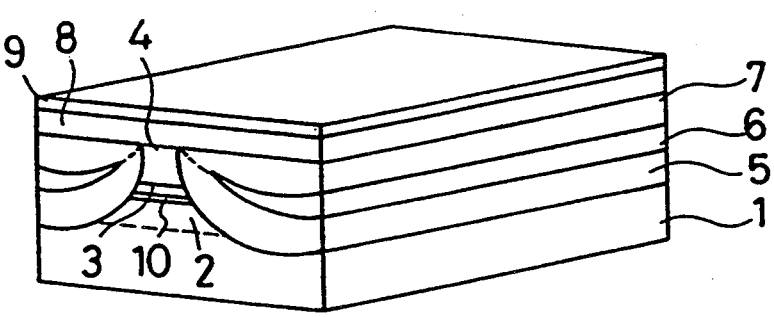

After removal of the resist pattern 11, the current confinement structure is formed by successively growing a p-type InP layer 5 about 0.5 micron thick having a carrier concentration of about $1 \times 10^{18}$ cm$^{-3}$ at room temperature, an n-type InP current blocking layer 6 about 1 micron thick and having a carrier concentration at room temperature of about $3 \times 10^{18}$ cm$^{-3}$, and a p-type InP current blocking layer 7 about 1.5 microns thick and having a carrier concentration of about $3 \times 10^{18}$ cm$^{-3}$ at room temperature. Most preferably, the layers of the current confinement structure are grown by LPE. The structure shown in FIG. 5(d) is completed by growing the n-type InP second upper cladding layer 8 having a carrier concentration at room temperature of about $3 \times 10^{18}$ cm$^{-3}$ to a thickness of about 2 microns followed by growth of an n-type In$_{0.82}$Ga$_{0.18}$As$_{0.4}$P$_{0.6}$ contacting layer 9 about 0.5 micron thick with a carrier concentration of about $3 \times 10^{18}$ cm$^{-3}$ at room temperature.

Figure 5E:
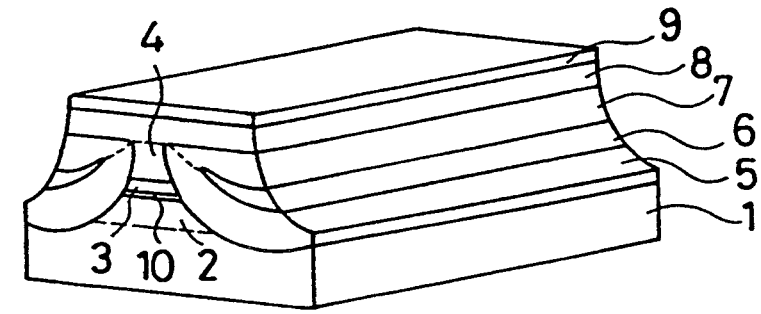

Finally, the structure is etched at the side surfaces to form a mesa shape (FIG. 5(e)) in order to reduce parasitic capacitances that arise at the pn junction between layers 6 and 7. To complete the structure, the SiO$_2$ film 20 is deposited and a window in that film is opened, followed by the formation of the electrodes 21 and 22. Generally, the opposing laser facets transverse to the active layer 3 are formed by cleaving the crystalline structure.

Figure 1:
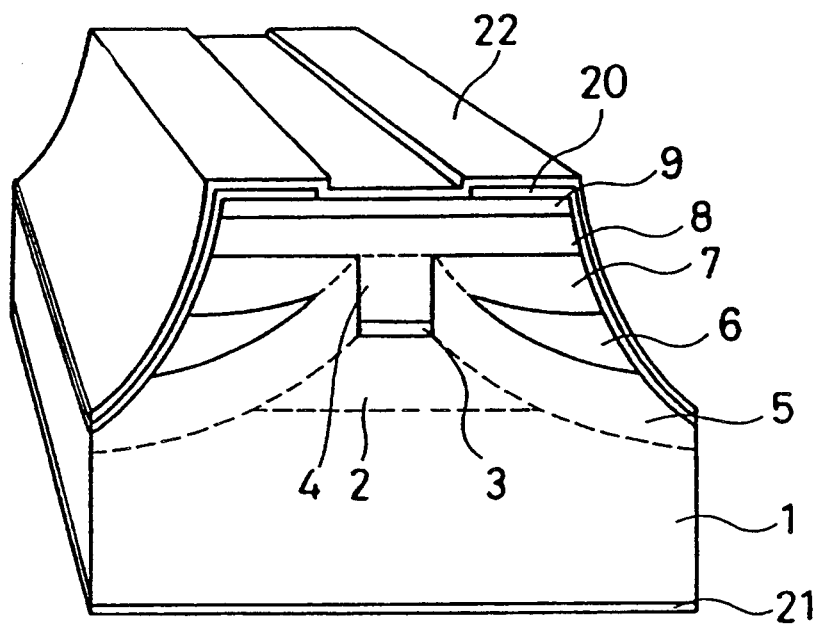
FIG. 1 is a perspective view showing the structure of a semiconductor laser according to the prior art.

The general operation of the semiconductor laser embodiment according to the invention is identical to the operation of the prior art semiconductor laser of FIG. 1 with the exception of the action of the BDR layer 10. That layer facilitates the injection of charge carriers into the active layer 3 as can be understood more clearly by reference to FIGS. 6(a) and 6(b).

Figure 2:
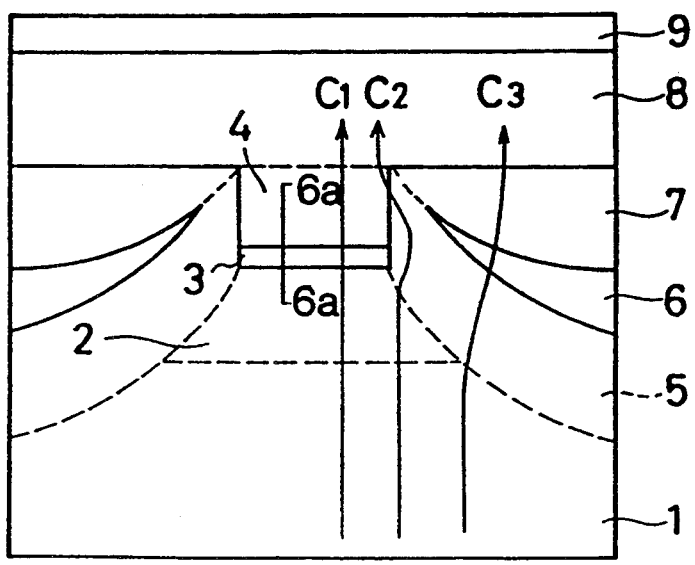
FIG. 2 is a cross-sectional view of the semiconductor laser of FIG. 1 illustrating current paths within the laser structure.
Figure 6A:
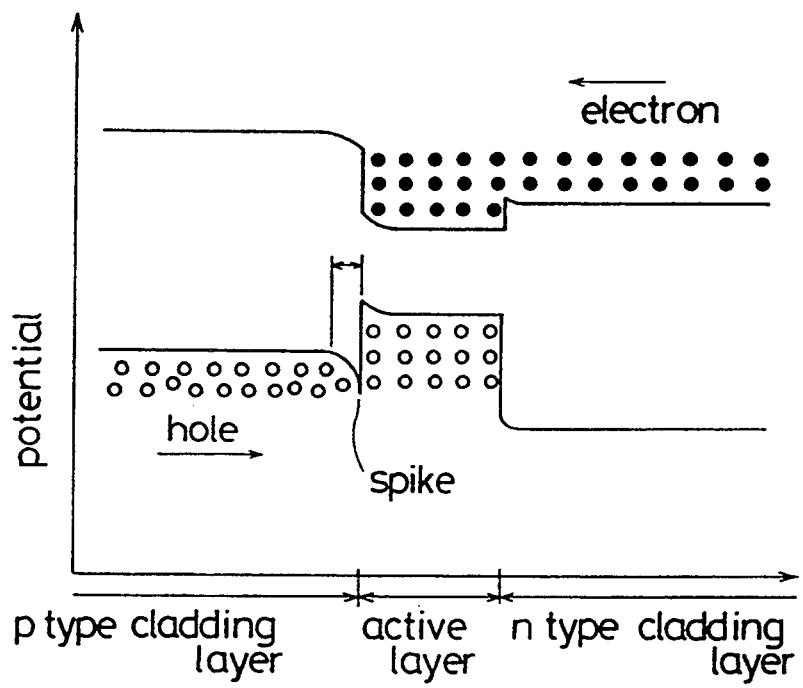
FIGS. 6(a) and 6(b) are energy band diagrams of a part of a prior art semiconductor laser and of a semiconductor laser according to the invention, respectively.
Figure 6B:
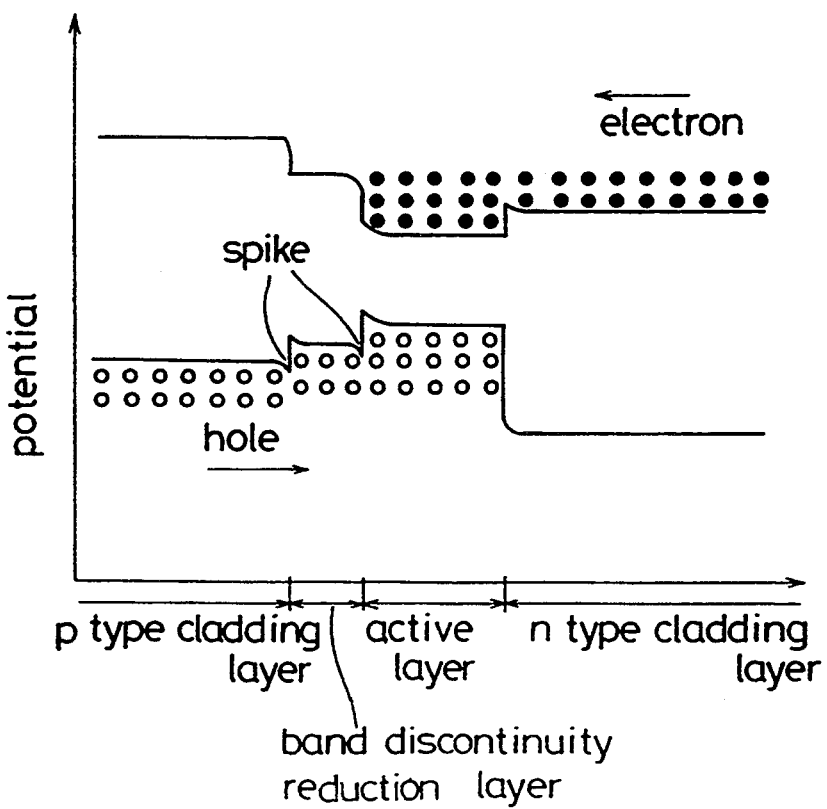

FIGS. 6(a) and 6(b) are energy band diagrams for portions of the prior art and novel semiconductor laser embodiments of FIGS. 2 and 4 taken along lines 6a—6a and 6b—6b, respectively. In these figures, electrons flow from the n-type upper cladding layer 4 toward the p-type cladding layer 2, i.e., to the left, and holes flow from the p-type cladding layer 2 toward the n-type upper cladding layer 4. In the energy band diagram of FIG. 6(a) for the prior art semiconductor laser, holes in the valence band flowing from the p-type cladding layer 2 to the active layer 3 must cross a potential barrier at the heterojunction between the cladding layer and the active layer. That potential barrier, a spike, is relatively large as compared to the corresponding potential barrier to electrons flowing from the n-type upper cladding layer 4 into the active layer 3. Since the holes must be given sufficient energy to surmount the energy barrier, the voltage applied to the semiconductor laser must be increased to achieve a particular current as compared to a structure in which the energy barrier is smaller. A relatively large energy barrier is present when the cladding layer is InP and the active layer is InGaAsP. The increased voltage that must be applied across the laser increases the leakage current, raising the operating temperature of the laser for a particular light output, thereby limiting the maximum light output power.

FIG. 6(b) is a band diagram for the semiconductor laser embodiment of FIG. 3 taken along line 6b—6b of FIG. 4. That structure includes the thin BDR layer 10 between the p-type InP cladding layer 2 and the InGaAsP active layer 3. Because of the presence of the BDR layer 10, the potential barrier of FIG. 6(a) is divided into two parts, one barrier between layers 2 and 10 and another barrier between layers 10 and 3. Since the energy of each of the potential barriers is reduced, as compared to the potential barrier of FIG. 6(a), holes are more easily injected from the cladding layer 2 into the active layer 3 than in the prior art laser structure. As a result, the voltage that must be applied to the semiconductor laser to produce a particular current flow is reduced as compared to the voltage that must be applied to the prior art semiconductor laser structure to produce the same current flow. Because of the lowered voltage, less leakage current flows so that the power output of the semiconductor laser can be increased for a particular operating temperature of the laser.

Figure 7A:
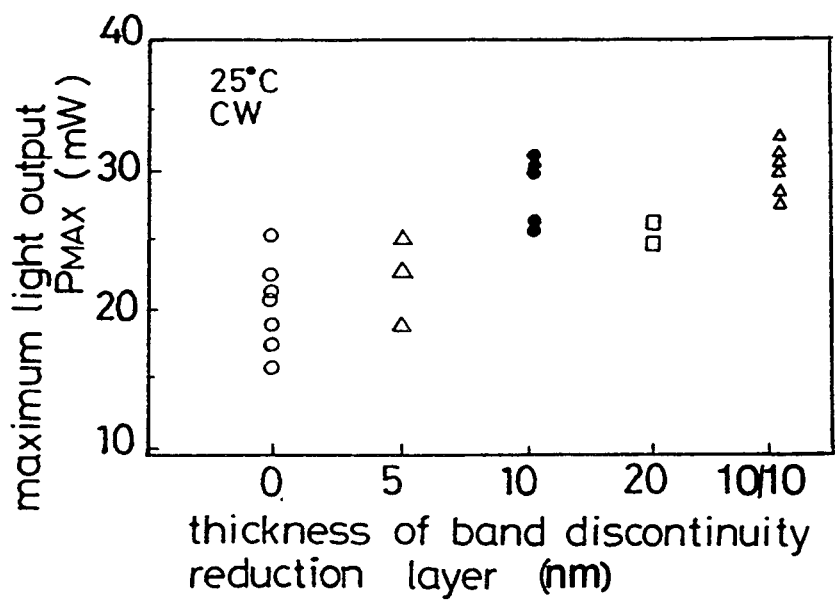
FIGS. 7(a) and 7(b) are graphs illustrating the performance of prior art semiconductor lasers and semiconductor lasers according to the invention, respectively.
Figure 7B:
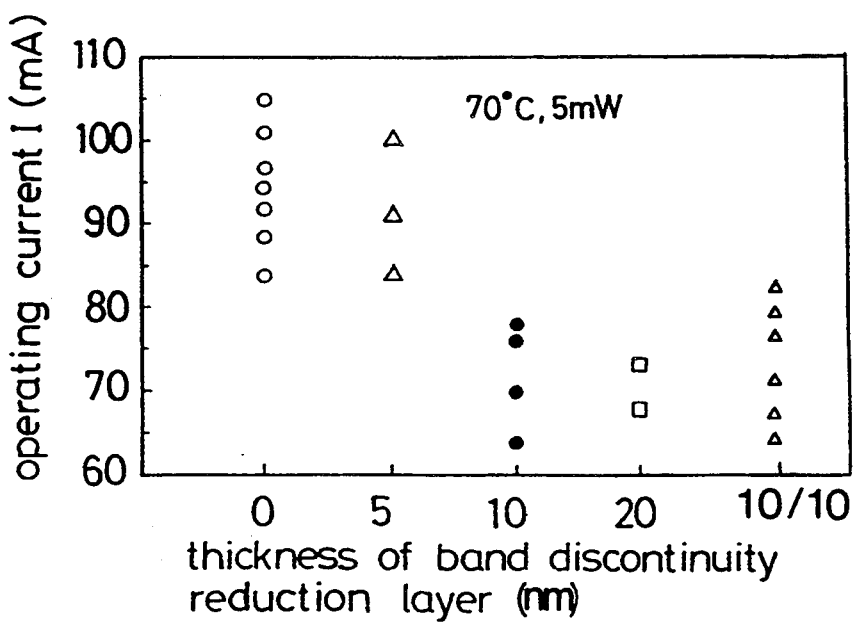

The maximum light power output of semiconductor lasers including the BDR layer as function of the thickness of the BDR layer is plotted in FIG. 7(a) for a large number of semiconductor lasers according to the invention. Each point plotted in FIGS. 7(a) and 7(b) represents an averaged value for ten semiconductor laser chips formed from one wafer. In FIG. 7(a), light power output was measured when the semiconductor laser was operated continuously at a temperature of 25° C. The white circles at the leftmost side of FIG. 7(a) represent the performance of semiconductor lasers according to the prior art, such as are shown in FIG. 1 of the application, where the thickness of the BDR layer is zero, i.e., when no BDR layer is present. The white triangles, dark circles, and white rectangles indicate the maximum power output for semiconductor lasers according to the invention and including BDR layers having thicknesses of five, ten, and twenty nm. The data reported in FIG. 7(a) indicate that the maximum power output is significantly increased in a semiconductor laser including a BDR layer ten nm thick. If the BDR layer is too thin or too thick, the maximum effect of the BDR layer is not achieved.

The data reported in FIG. 7(b) for a fixed power output and operating temperature of semiconductor lasers clearly illustrate that the operating current is significantly reduced for a particular light output power by the addition of the BDR layer 10 of a desired thickness. Again, the leftmost points, the white circles, indicate measured performance data for prior art semiconductor lasers. The white triangles, black circles, and white rectangles represent the performance of semiconductor lasers according to the invention with BDR layer thicknesses of five, ten, and twenty nm. The data clearly indicate that the operating current is minimized at a particular BDR layer thickness and that a BDR layer too thick or too thin does not achieve the advantages of the invention.

From an analysis of the measured data and a theoretical analysis of the operation of the semiconductor laser, it is apparent that the advantages of the invention are achieved if the BDR layer has a thickness in a range from five to forty nm. It is known that the potential barrier, i.e., the spike, of FIG. 6(a) occupies a thickness of approximately five nm in the semiconductor material. Accordingly, if the BDR layer is less than about five nm thick, the two potential barriers of FIGS. 6(b) merge so that the beneficial effects of dividing the potential barrier into two parts are not achieved by the presence of a thin BDR layer. On the other hand, if the BDR layer is too thick, since its energy band gap is smaller than the energy band gap of the adjacent cladding layer, charge carries in the active layer flow relatively easily through the BDR layer to and from the active layer. If the BDR layer is too thick, these free charge carriers in the BDR layer absorb light and reduce the efficiency of the semiconductor laser. In addition, the relatively high concentration of charge carriers in the BDR layer results in a broadening of the spectral width of the light emitted by the semiconductor laser due to the plasma effect.

Figure 8:
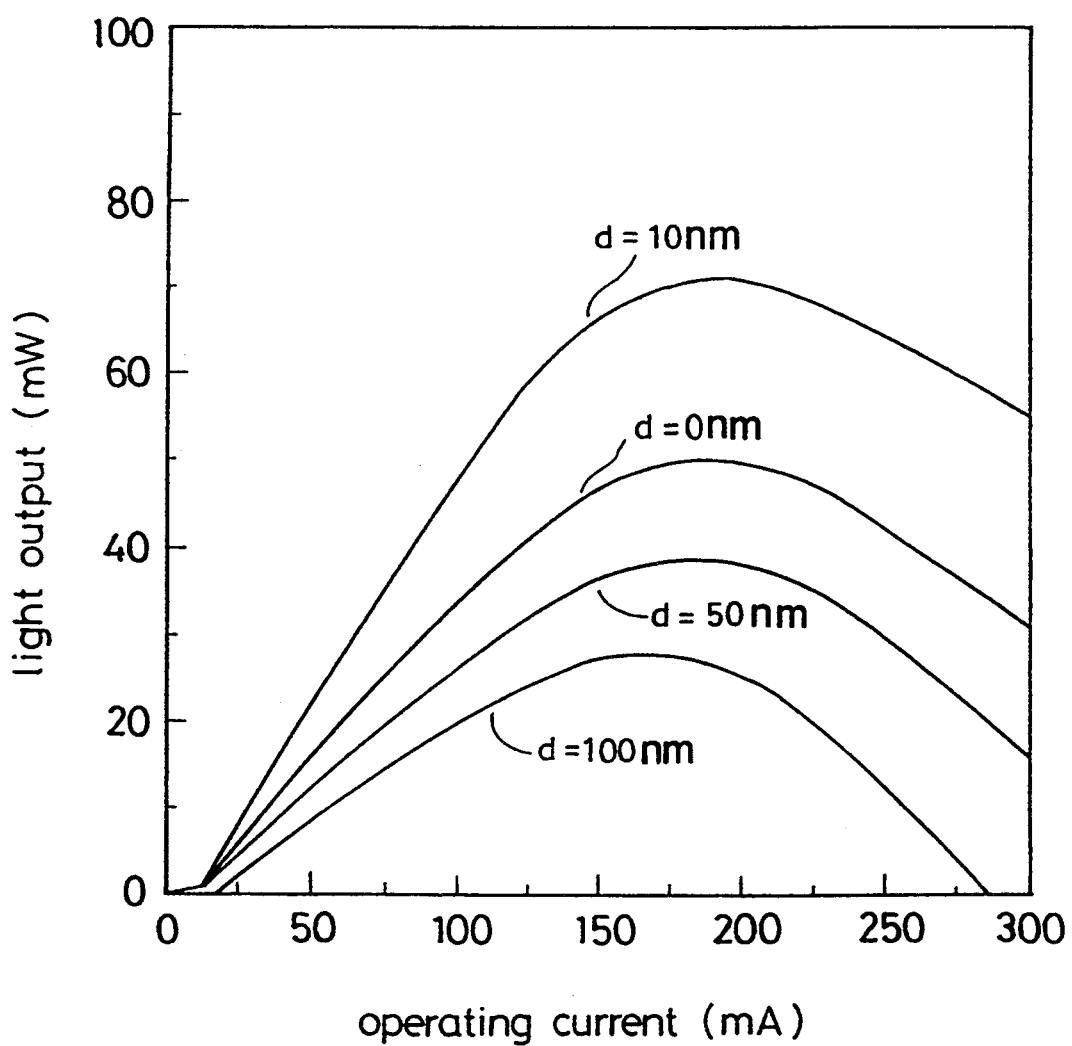
FIG. 8 is a graph illustrating light output as a function of operating current in semiconductor lasers including band gap discontinuity reduction layers with the thickness of the band gap discontinuity reduction layer as the parameter of the graph.

As a further demonstration of the variation of semiconductor laser performance characteristics with the thickness of the BDR layer, in FIG. 8 the light output of a laser as a function of operating current is plotted with the thickness of the BDR layer, d, as a parameter. That graph indicates that when the BDR layer is fifty nm thick, the performance of the semiconductor layer is poorer than if the BDR layer is absent. On the other hand, substantial improvements are achieved when the BDR layer is ten nm thick as compared to a laser without a BDR layer, i.e., d=0. From the data plotted in FIG. 8, it was determined that the maximum BDR thickness that provided an advantage over the prior art was about forty nm.

Figure 9A:
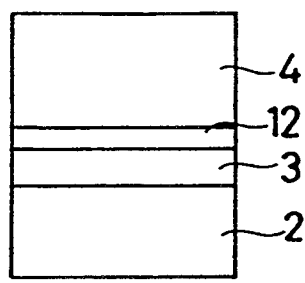
FIGS. 9(a) and 9(b) respectively illustrate the structure and an energy band diagram of part of a semiconductor laser according to a second embodiment of the invention.
Figure 9B:
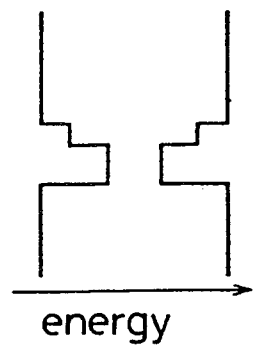

FIGS. 9(a) and 9(b) are, respectively, a schematic diagram of the active region of a semiconductor laser and an energy band diagram of that part of a semiconductor laser according to a second embodiment of the invention. The energy band diagram of FIG. 9(b) is turned ninety degrees with respect to the energy band diagrams of FIGS. 6(a) and 6(b) in order to show the relative energy band gaps adjacent the corresponding layers in FIG. 9(a). In FIG. 9(a), an n-type InGaAsP BDR layer 12 is disposed between and in contact with the InGaAsP active layer 3 and the InP upper cladding layer 4. As in the first embodiment, although the constituents of both the active layer 3 and the BDR layer 12 are the same, their relative ratios in the two layers are different so that a heterojunction is formed between the active layer 3 and the BDR layer 12. In this second embodiment, as illustrated in FIG. 9(b), the BDR layer 12 has a narrower energy band gap than the upper cladding layer 4 and a wider energy band gap than the active layer 3. As in the first embodiment of the invention, the thickness of the BDR layer 12 is in a range from five to forty nm.

In the first embodiment, the potential barrier between the cladding layer 2 and the active layer 3 at the valence band edge is significant in size. There is also a smaller potential barrier between the upper cladding layer 4 and the active layer 3 in the conduction band. The BDR layer 12 reduces the effect of the potential barrier in the conduction band so that electrons are more easily injected into the active layer 3 than in a corresponding semiconductor laser without the BDR layer 12.

Figure 10A:
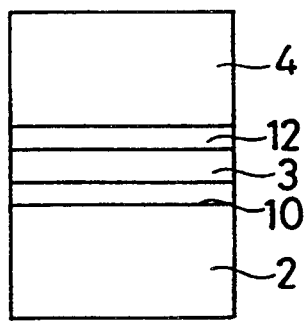
FIGS. 10(a) and 10(b) respectively illustrate the structure and an energy band diagram of part of a semiconductor laser according to a third embodiment of the invention.
Figure 10B:
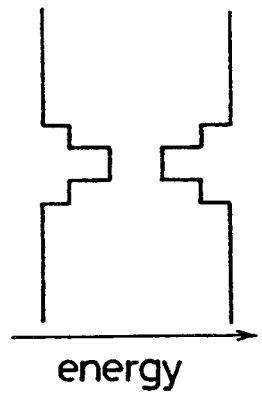

FIGS. 10(a) and 10(b) illustrate a third embodiment of the invention. In that embodiment, as shown schematically in FIG. 10(a), BDR layers 10 and 12 are disposed on opposite sides of and sandwich the active layer 3. The corresponding energy band diagram is illustrated in FIG. 10(b). Each of the BDR layers 10 and 12 has an energy band gap intermediate the energy band gaps of the active layer 3 and the lower and upper cladding layers 2 and 4. Since two BDR layers are present, both hole and electron injection into the active layer 3 is facilitated by those BDR layers. The voltage required to drive the semiconductor laser is reduced still further, increasing power output over the light power produced by a semiconductor laser without both of the BDR layers.

The performance of semiconductor lasers according to the third embodiment of the invention is shown in FIGS. 7(a) and 7(b). There, at the rightmost side of each figure, maximum power output and operating current are respectively indicated for a semiconductor laser having two BDR layers, each ten nm thick. As can be seen in FIG. 7(a), for continuous operation at 25° C., the maximum power output is somewhat improved as compared to similar lasers including only a single BDR layer ten nm thick. Some reduction in operating current is shown in FIG. 7(b) for the semiconductor laser including two BDR layers, each ten nm thick.

The third embodiment of the invention as illustrated in FIGS. 10(a) and 10(b) includes BDR layers of identical composition, thereby having the same energy band gap. The energy band gaps of the two BDR layers need not be the same so long as each of those energy band gaps is intermediate the energy band gap of the active layer and the adjacent cladding layer. Likewise, it is not necessary for the BDR layers to be of the same thickness so long as the thickness of each layer is within the range of five to forty nm.

Figure 11A:
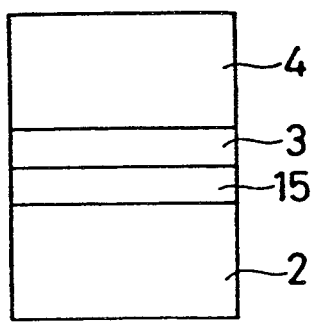
FIGS. 11(a) and 11(b) respectively illustrate the structure and an energy band diagram of part of a semiconductor laser according to a fourth embodiment of the invention.
Figure 11B:
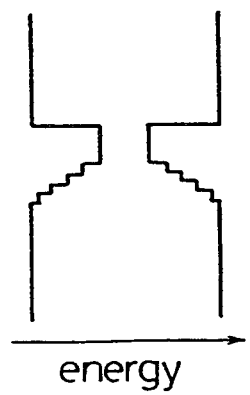

Still another embodiment of the invention is illustrated in FIGS. 11(a) and 11(b). In that structure, a p-type InGaAsP BDR layer 15 including a plurality of films of different energy band gaps is disposed between the active layer 3 and the lower cladding layer 2. The energy band gaps of the respective films within the BDR layer 15 are all smaller than the energy band gap of the lower cladding layer 2 and larger than the energy band gap of the active layer 3. The energy band gaps of the films decrease in steps from the cladding layer 2 to the active layer 3. The total thickness of the BDR layer 15 is within the range of five to forty nm. The multiple films within the BDR layer 15 divide the potential barrier into a plurality of smaller potential barriers that make it easier to inject holes into the active layer and reduce leakage current.

Figure 12A:
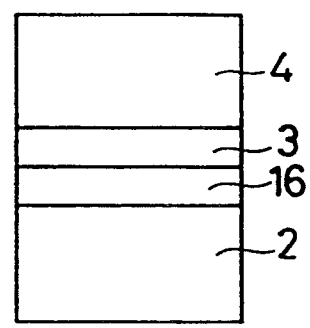
FIGS. 12(a) and 12(b) respectively illustrate the structure and an energy band diagram of part of a semiconductor lasers according to a fifth embodiment of the invention.
Figure 12B:
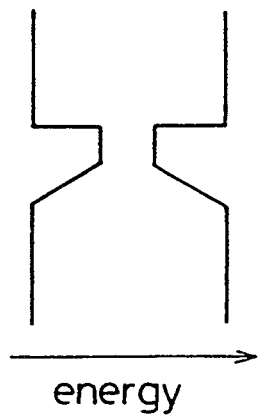

Still another embodiment of the invention is illustrated in FIGS. 12(a) and 12(b). There, the BDR layer 16 has a continuously varying composition and energy band gap extending from the lower cladding layer 2 to the active layer 3. Ideally, the composition of the BDR layer 16 is varied so that nearly an exact match of energy band gaps occurs at the interfaces of the BDR layer 16 with the lower cladding layer 2 and the active layer 3.

Figure 13:
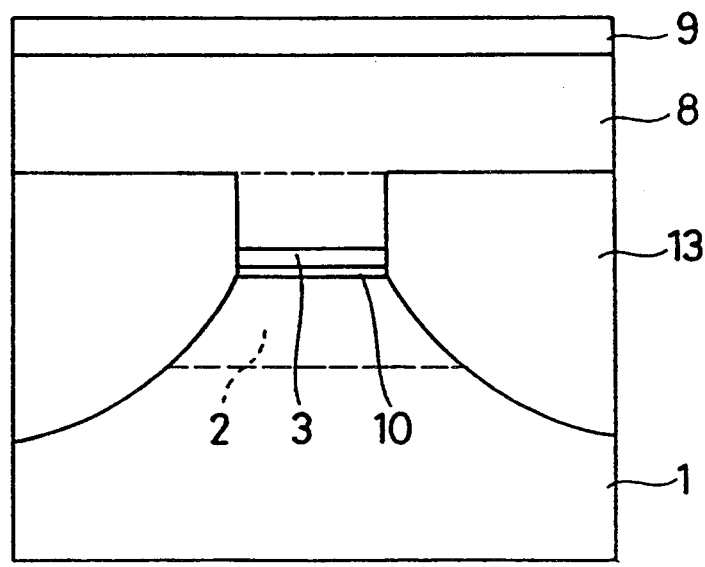
FIG. 13 is a cross-sectional view of a semiconductor laser according to an alternative embodiment of the invention.

Although the embodiment of the invention illustrated in FIG. 3 includes a pnpn thyristor current confinement structure, that current confinement structure may be simpler, such as the single layer 13 of the cross-sectional view of a semiconductor laser according to an embodiment of the invention shown in FIG. 13. The current blocking layer 13 may be a semi-insulating layer. The other elements of the laser shown in FIG. 13 are as previously described.

Figure 14:
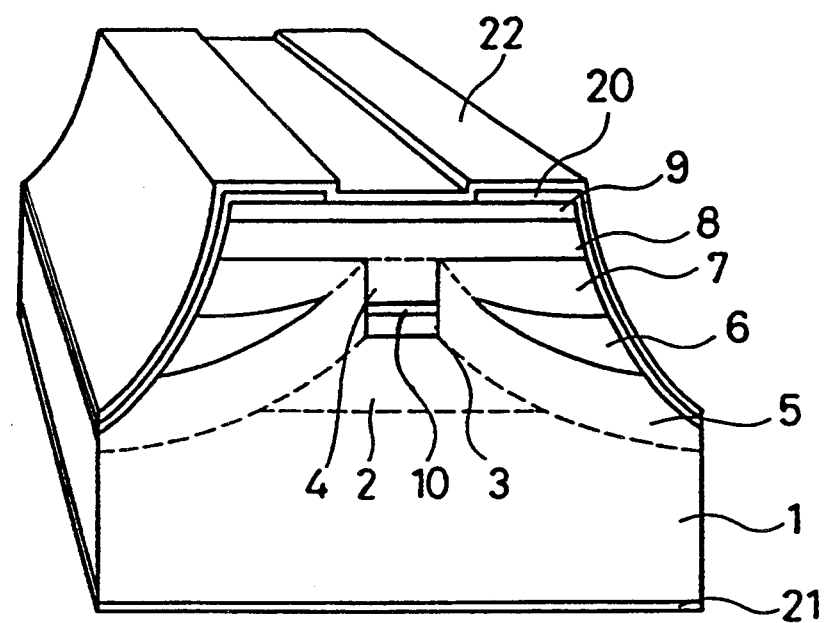
FIG. 14 is a perspective illustrating the structure of a semiconductor laser according to an embodiment of the invention.

In the foregoing description, emphasis has been placed upon a structure including a p-type lower cladding layer and an n-type upper cladding layer. However, a similar structure including an n-type lower cladding layer and a p-type upper cladding layer sandwiching an active layer with a BDR layer interposed between the p-type upper cladding layer and the active layer is within the scope of the invention. Such a structure is shown in FIG. 14. It is important, in any case, that the BDR have the same conductivity type as the cladding layer it contacts, regardless of whether that contacted cladding layer is the upper cladding layer or the lower cladding layer.

The invention has been described with respect to particular embodiments. However, various modifications and additions within the spirit of the invention will occur to those of skill in the art. Accordingly, the scope of the invention is limited solely by the following claims.

I claim:

1. A semiconductor laser comprising:
   a semiconductor substrate of a first conductivity type;
   a double heterojunction structure comprising a lower cladding layer of the first conductivity type disposed on the semiconductor substrate and having a first energy band gap, a band gap discontinuity reduction layer of the first conductivity type having a thickness from five to forty nanometers disposed on the lower cladding layer and having a second energy band gap, an undoped active layer disposed on the band gap discontinuity reduction layer and having a third energy band gap smaller than the first energy band gap, the second energy band gap being intermediate the first and third energy band gaps, and an upper cladding layer of a second conductivity type, opposite the first conductivity type, disposed on the active layer and having a fourth energy band gap larger than the third energy band gap, the double heterojunction structure having a ridge shape;
   a current confinement structure disposed on opposite sides of the double heterojunction structure for confining current flow to the double heterojunction structure; and
   first and second electrodes electrically contacting the semiconductor substrate and the upper cladding layer, respectively.

2. The semiconductor laser of claim 1 wherein the first conductivity type is p type.

3. The semiconductor laser of claim 1 wherein the first conductivity type is n type.

4. The semiconductor laser of claim 1 including a second band gap discontinuity reduction layer disposed between the active layer and the upper cladding layer and having an energy band gap intermediate the third and fourth energy band gaps and a thickness of five to forty nanometers.

5. The semiconductor laser of claim 1 wherein the band gap discontinuity reduction layer comprises a plurality of laminated semiconductor films, each film having an energy band gap no larger than the first energy band gap and no smaller than the third energy band gap.

6. The semiconductor laser of claim 1 wherein the energy band gap of the band gap discontinuity reduction layer varies continuously with position from the first energy band gap to the third energy band gap between the lower cladding layer and the active layer.

7. The semiconductor laser of claim 1 wherein the current confinement structure comprises a pnpn thyristor structure.

8. The semiconductor laser of claim 1 wherein the current confinement structure comprises a semi-insulating semiconductor material.

9. The semiconductor laser of claim 1 wherein the upper and lower cladding layers are InP and the active and band gap discontinuity reduction layers are InGaAsP.

10. The semiconductor laser of claim 9 wherein the band gap discontinuity reduction layer is $In_{0.82}Ga_{0.18}As_{0.4}P_{0.6}$ and the active layer is $In_{0.58}Ga_{0.42}As_{0.9}P_{0.1}$.

11. The semiconductor laser of claim 1 including a contacting layer of the second conductivity type electrically contacting the upper cladding layer.

12. The semiconductor laser of claim 11 including a second upper cladding layer of the second conductivity type interposed between and contacting the upper cladding layer and the contacting layer.

13. A semiconductor laser comprising:
a semiconductor substrate of a first conductivity type;
a double heterojunction structure comprising a lower cladding layer of the first conductivity type disposed on the semiconductor substrate and having a first energy band gap, an undoped active layer disposed on the lower cladding layer and having a second energy band gap smaller than the first energy band gap, a band gap discontinuity reduction layer of a second conductivity type, opposite the first conductivity type, having a thickness from five to forty nanometers disposed on the active layer and having a third energy band gap, and an upper cladding layer of the second conductivity type, disposed on the band gap discontinuity reduction layer and having a fourth energy band gap, the third energy band being intermediate the second and fourth energy band gaps and the first energy band gap being larger than the second band gap, the double heterojunction structure having a ridge shape;
a current confinement structure disposed on opposite sides of the double heterojunction structure for confining current flow to the double heterojunction structure; and first and second electrodes electrically contacting the semiconductor substrate and the upper cladding layer, respectively.

14. The semiconductor laser of claim 13 wherein the first conductivity type is p type.

15. The semiconductor laser of claim 13 wherein the first conductivity type is n type.

16. The semiconductor laser of claim 13 including a second band gap discontinuity reduction layer disposed between the active layer and the lower cladding layer and having an energy band gap intermediate the first and second energy band gaps and a thickness of five to forty nanometers.

17. The semiconductor laser of claim 13 wherein the band gap discontinuity reduction layer comprises a plurality of laminated semiconductor films, each film having an energy band gap no larger than the first energy band gap and no smaller than the third energy band gap.

18. The semiconductor laser of claim 13 wherein the energy band gap of the band gap discontinuity reduction layer varies continuously with position from the second energy band gap to the fourth energy band gap between the lower active layer and the upper cladding layer.

19. The semiconductor laser of claim 13 wherein the current confinement structure comprises a pnpn thyristor structure.

20. The semiconductor laser of claim 13 wherein the upper and lower cladding layers are InP and the active and band gap discontinuity reduction layers are InGaAsP.

21. The semiconductor laser of claim 20 wherein the band gap discontinuity reduction layer is $In_{0.82}Ga_{0.18}As_{0.4}P_{0.6}$ and the active layer is $In_{0.58}Ga_{0.42}As_{0.9}P_{0.1}$.

22. The semiconductor laser of claim 13 including a contacting layer of the second conductivity type electrically contacting the upper cladding layer.

23. The semiconductor laser of claim 22 including a second upper cladding layer of the second conductivity type interposed between and contacting the upper cladding layer and the contacting layer.

* * * * *